Figure 1:
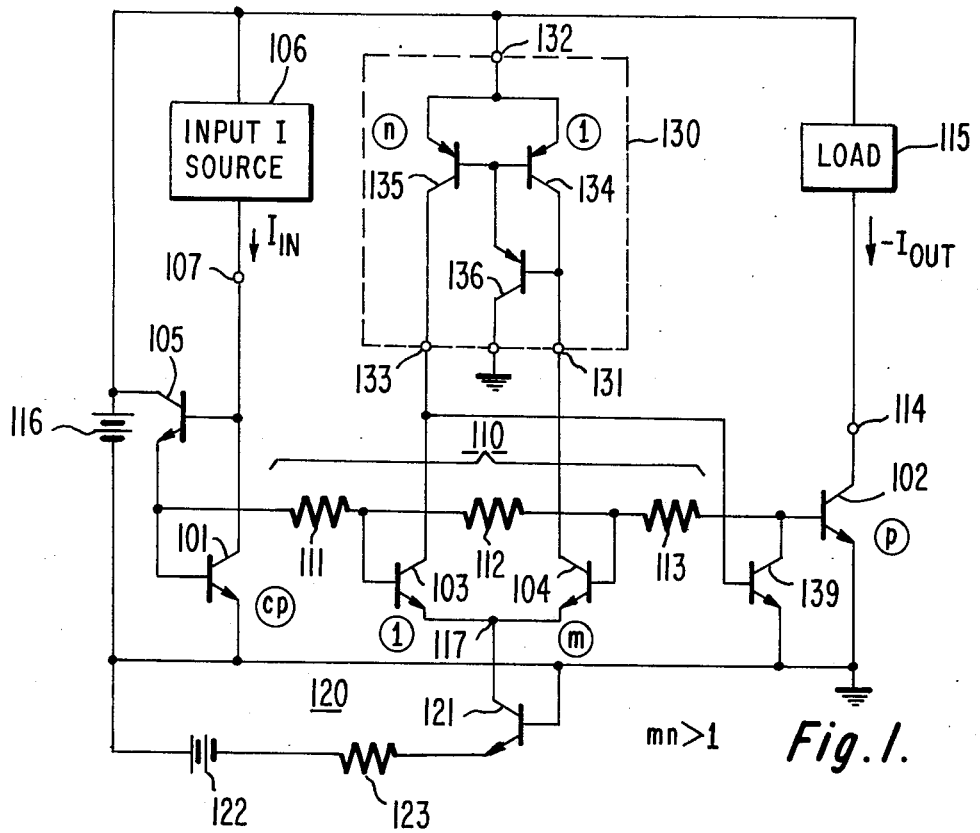

United States Patent [19]

Ahmed

[11] 4,055,774
[45] Oct. 25, 1977

[54] CURRENT SCALING APPARATUS

[75] Inventor: Adel Abdel Aziz Ahmed, Annandale, N.J.

[73] Assignee: RCA Corporation, New York, N.Y.

[21] Appl. No.: 690,719

[22] Filed: May 27, 1976

[30] Foreign Application Priority Data

Sept. 26, 1975 United Kingdom ............... 39619/75

[51] Int. Cl.² ........................................... H03K 17/00
[52] U.S. Cl. .............................. 307/296 R; 307/310; 323/22 T; 330/296
[58] Field of Search ........... 307/296, 397, 310, 235 R, 307/229; 323/19, 22 T; 330/23, 40, 22; 340/347 AD

[56] References Cited

U.S. PATENT DOCUMENTS

| | | | |
|---|---|---|---|
| 3,612,984 | 10/1971 | Davis | 323/22 T |
| 3,617,859 | 11/1971 | Dobkin | 323/22 T |
| 3,851,241 | 11/1974 | Wheatley, Jr. | 307/310 |
| 3,867,685 | 2/1975 | Ahmed | 330/22 |

Primary Examiner—Stanley D. Miller, Jr.
Assistant Examiner—B. P. Davies
Attorney, Agent, or Firm—H. Christoffersen; S. Cohen; A. L. Limberg

[57] ABSTRACT

The difference between the base potentials of a pair of transistors, which are interconnected at their emitter electrodes and operated with different densities of current flow through their base-emitter junctions, is scaled up by a fixed ratio and applied between the base electrodes of another pair of transistors with interconnected emitter electrodes to cause their collector currents to flow in a desired ratio.

27 Claims, 8 Drawing Figures

CURRENT SCALING APPARATUS

In current scaling apparatus embodying the present invention, the difference between the base potentials of one pair of transistors interconnected at their emitter electrodes and operated with different densities of current flow through their base-emitter junctions is scaled up by a fixed ratio and applied between the base electrodes of another pair of transistors interconnected at their emitter electrodes to determine the ratio between their respective collector currents.

In the drawing, each of the FIGURES shows a different embodiment of the present invention. More particularly, each of FIGS. 1, 2, 3 and 4 is a schematic diagram of a current scaling apparatus for responding to an applied input current with an output current smaller than and proportional to the input current, and each of FIGS. 5, 6, 7 and 8 is a schematic diagram of a current scaling apparatus for responding to an applied input current with an output current larger than and proportional to the input current.

In each of the Figures, the first digit of an identification numeral is that of the Figure; if the rest of the digits in a pair of identification numbers are similar they identify corresponding elements in the two figures.

In FIG. 1, transistor 101 is provided direct-coupled collector-to-base feedback by the emitter-follower action of transistor 105. This feedback adjusts the base-emitter potential $V_{BE101}$ of transistor 101 to such value as to condition transistor 101 to accept as collector current all of the input current $I_{IN}$ supplied to input terminal 107 from source 106 except that small amount required as base current for transistor 105. A voltage equal to $V_{BE101}$ minus the potential drop across the input port of the resistive potential divider 110 (that is, across resistive elements 111, 112 and 113) appears as the base-emitter potential $V_{BE102}$ of transistor 102. Responsive to $V_{BE102}$, transistor 102 demands a collector current $-I_{OUT}$, relatively small as compared to $I_{IN}$, which is supplied to its collector electrode via output terminal 114. In FIG. 1, this current flows through a load 115, which has a direct current conductive path therethrough from a positive potential supply 116.

The potential drop across the serially connected resistive elements 111, 112, 113 in potential divider 110 is due primarily to the flow of the collector current of common-emitter amplifier transistor 139 through these elements. The portion of this potential drop appearing across the output port of potential divider 110—i.e., across resistive element 112—is applied between the base electrodes of transistors 103 and 104 and determines the relative proportions of their collector currents. These collector currents are then differentially compared to obtain an error signal which controls the conduction of transistor 139, thus completing a degenerative feedback loop for regulating the potential between the base electrodes of transistors 103 and 104 to a predictable value. Since substantially the same current flows through each of resistive elements 111, 112, 113, the potential between the base electrodes of transistors 101 and 102—i.e., across the input port of potential divider 110—will, by Ohm's Law, be larger than the potential maintained between the base electrodes of transistors 103 and 104 by a constant factor dependent on the relative resistances of these resistive elements.

Describing the current scaling apparatus in more detail, the emitter electrodes of transistors 103 and 104 are directly connected together at an interconnection 117. A constant current sink 120, as provided from the collector electrode of transistor 121 with its emitter electrode biased by negative potential supply 122 and emitter degeneration resistor 123, is connected to interconnection 117 to regulate the sum of the emitter currents of transistors 103 and 104. The collector current of transistor 104 is applied to the input terminal 131 of a current amplifier 130 to cause a responsive current -n times as large at its output terminal 133. This current less the collector current of common-emitter amplifier transistor 103 is applied as an error signal to the base electrode of transistor 139.

The reasons for $V_{BE103}$ being larger than $V_{BE104}$ in order to obtain an error signal approaching zero-value will be considered after the following preliminary observations. The performance of a transistor having a base-emitter junction is in close accordance with the following equation.

$$V_{BE} = (kT/g)ln(I_e/AJ_s) = (kT/q)ln(I_c/\alpha AJ_S) \qquad (1)$$

where:
$V_{BE}$ is the base-emitter potential of the transistor,
$k$ is Boltzmann's constant,
T is the absolute temperature of the base-emitter junction,
$q$ is the charge on an electron,
$I_E$ is the transistor emitter current,
$I_C$ is the transistor collector current smaller than its emitter current by the factor $\alpha$ which approaches unity in value;
A is the effective area of the base-emitter junction (which is related to the actual area of the base-emitter junction, to the shape of the base-emitter junction, and to the transistor collector efficiency),
$J_S$ is the density of current through the base-emitter junction for $V_{BE} = O$.

In a monolithic integrated circuit, transistors simultaneously fabricated in the same basic semiconductor material by the same processing steps have substantially the same $J_S$ and $\alpha$, and transistors located close by each other have substantially identical T. $V_{BE}$, $I_E$, A and $J_S$ will bear the identification numeral of the particular transistors with which they are associated as subscripts. In the drawing, the same encircled numerals of letters near the emitter electrodes of transistors express the ratio of the effective areas of their base-emitter junctions to other transistors of the same conductivity type.

Current amplifier 130 is shown as being of the type commonly known as a "current mirror amplifier"; it comprises transistors 134, 135 and 136. $A_{135}$ being $n$ times as large as $A_{134}$. Connected emitter-to-emitter at terminal 132, to which supply 116 applies positive potential, and connected base-to-base, transistors 134 and 135 have the same base-emitter potentials causing their respective emitter currents to be 1:$n$ ratio. There is a 1:$n$ ratio between their respective collector currents which are larger than their respective emitter currents by the same factor, $\alpha_{PNP}$, their common-base forward current gain. Transistor 134 is provided direct coupled collector-to-base feedback by the common-collector-amplifier action of transistor 136. This feedback regulates the base-emitter potential of transistor 134 to cause its collector current to supply the entire collector current demand of transistor 104 except for that relatively small proportion supplied by the base current of transistor 136. A current with amplitude n times that of the collector current of transistor 104 is thus differentially combined with the collector current of transistor 103 to give rise to the error signal applied to the base electrode of transistor 139.

This means that n times as much collector current flows to transistor 103 as to transistor 104 to obtain a zero-valued error signal. If n be greater than one, this is associated with a higher density of current flow through transistor 103 than through transistor 104. The density of current flow through the base-emitter junction of transistor 103 may be increased vis-a-vis that of transistor 104 by making the ratio of $A_{104}/A_{103} = m$, larger than unity, also. These two effects may be used alternatively or cooperatively to increase the density of current flow through the base-emitter junction of transistor 103 over that of transistor 104, thereby to cause $V_{BE103}$ to exceed $V_{BE104}$. That is, in the current scaling apparatus shown in FIG. 1, the product mn exceeds unit in value.

Proceeding from equation 1, an expression for the value of the potential difference ($V_{BE103} - V_{BE104}$) between the base electrodes of transistors 103 and 104 can be derived.

$$V_{BE103} = (kT/q)ln(I_{C103}/A_{103}J_s) \qquad 2$$

$$V_{BE104} = (kT/q)ln(I_{C104}/A_{104}J_s) \qquad 3$$

$$(V_{BE103} - V_{BE104}) = (kT/q)ln(I_{C103}/I_{C104}) + (kT/q)ln(A_{104}/A_{103}) \qquad 4$$

For the error signal to be zero valued, $I_{C103}$ is, as noted above, n times as large as $I_{C104}$; and $A_{104}$ is m times $A_{103}$. This observations combine with equation 4 to yield equation 5.

$$(V_{BE103} - V_{BE104}) = (kT/q)ln(n) + (kT/q)ln(m) = (kT/q)ln(mn) \qquad 5$$

The difference between $V_{BE103}$ and $V_{BE104}$ is, as can be seen from equation 5, directly proportional to the operating temperature T of the transistors and substantially independent of the common-emitter forward current gains ($h_{fe}$'s) of the transistors. This means this potential is amenable to being proportionally scaled up for application between the base electrodes of transistors 101 and 102 for providing a constant ratio between their collector currents despite changes in T.

Since substantially the same current flows through each of the resistive elements 111, 112 and 113, the following equation can be written in accordance with Ohm's law.

$$(V_{BE101} - V_{BE102})/(R_{111}+R_{112}+R_{113}) = (V_{BE103} - V_{BE104})/R_{112} \qquad 6$$

$R_{111}$, $R_{112}$ and $R_{113}$ are the resistances of resistive elements 111, 112, and 113, respectively. An expression for $V_{BE101} - V_{BE102}$ in terms of $I_{C101}$ and $I_{C102}$ can be derived from equation 1 per equations 7, 8 and 9, following:

$$V_{BE101} = (kT/q)ln(I_{C101}/A_{101}J_s) \qquad 7$$

$$V_{BE102} = (kT/q)ln(I_{C102}/A_{102}J_s) \qquad 8$$

$$(V_{BE101} - V_{BE102}) = (kT/q)ln(I_{C101}/I_{C102}) + (kT/q)ln(A_{102}/A_{101}) = (kT/q)ln(I_{C101}/I_{C102}) + (kT/q)(p/pc) = (kT/q)ln(I_{C101}/cI_{C102}) \qquad 9$$

Substitution of equation 6 into equation 9 yields equation 10, and substitution of equation 5 into equation 10 yields equation 11.

$$(V_{BE103} - V_{BE104})(R_{111}+R_{112}+R_{113})/R_{112} = (kT/q)ln(I_{C101}/CI_{C102}) \qquad 10$$

$$[(kT/q)ln(mn)](R_{111}+R_{112}+R_{113})/R_{112} = (kT/q)ln(I_{C101}/cI_{C102}) \qquad 11$$

Equation 11 can be rewritten as equation 12. Note that the temperature terms cancel, that is, the ratio of $I_{C102}$ to $I_{C101}$ is independent of temperature.

$$I_{C102} = I_{Cj101}/c \ (mn)^{[(R_{111}30\ R_{112}+R_{113})/R_{112}]} \qquad 12$$

If the product mn has a modest value, a fairly small potential division ratio of $(R_{111}+R_{112}+R_{113})/R_{112}$ will cause $I_{C102}$ to much smaller than $I_{C101}$. For example, supposing C=1, m=5, n=2, $(R_{11}+R_{112}+R_{113})/R_{112} = 4$, Then $I_{C102}$ will be $I_{C101}/10000$ to very good approximation.

The skilled integrated-circuit electronics designer will perceive that the FIG. 1 circuit may be modified in several respects without departing from the inventive teaching of this application. For example, since the value of current supplied to interconnection 117 is not critical, constant-current source 120 may be replaced by a current source, the output current of which is subject to variation. Current source 120 may be replaced by a resistive element connecting interconnection 117 to a negative potential supply, for example, and elements 121 and 123 dispensed with. As another example, one of the resistive elements 111 and 113 may be replaced by a direct connection. Also, if the current drawn through resistive potential divider 110 is relatively small compared to the input current $I_{In}$, transistor 101 may have its collector electrode direct coupled to its base electrode by means of a direct connection rather than by the emitter-follower action of transistor 105. Also, any of a variety of known current mirror amplifier configuration may replace the particular type of current mirror amplifier 130 shown in FIG. 1. Other modifications also are possible.

The current scaling apparatus of FIG. 2 differs from that of FIG. 1 in the following particulars. The collector electrodes of transistors 203 and 204 are connected to the input connection 241 and the output connection 243, respectively, of current mirror amplifier 240. Current mirror amplifier 240 has a current gain of $-1/n$ rather than n, so the error signal applied to the base electrode of transistor 248 is $-1/n$ times the collector current of transistor 203 plus the collector current of transistor 204. That is, the error signal here tends to be smaller by a factor of n and reversed in polarity as compared with the scheme used in FIG. 1. The cascade of common-emitter amplifiers 248 and 249 is a non-inverting amplifier configuration, as contrasted with the inverting amplifier provided by common-emitter amplifier 139 in FIG. 1 and has the additional current gain of transistor 248 has a factor in its current gain. So, the current proportional to error signal applied to resistive potential divider 210 is similar to the current proportional to error signal applied to resistive potential divider 110 in FIG. 1, both in amplitude and in direction.

Figure 2:
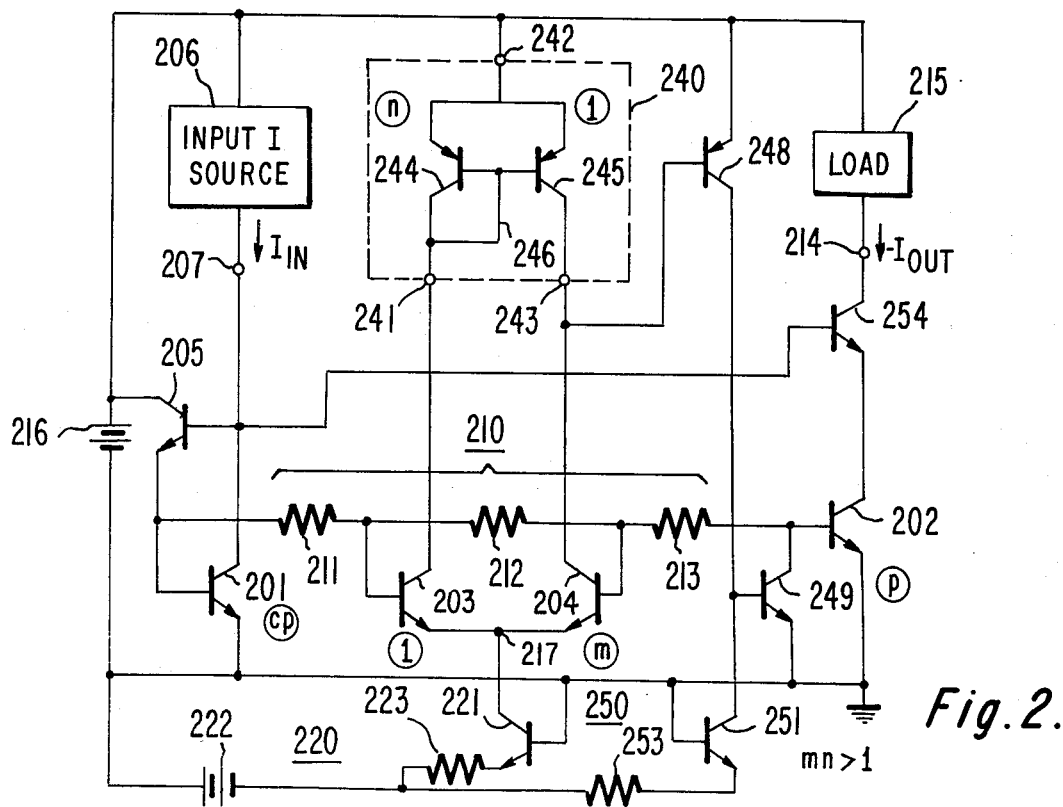

The same equations that describe the current scaling apparatus of FIG. 1 describe that of FIG. 2 if one augment each of the numerical subscripts by 100. Indeed, the equations 1–12 will describe any of the embodiments of the invention shown in FIGS. 2–8, simply by changing the initial 1 in the identification numeral subscript to the number of figures involved.

Current mirror amplifier 240 includes transistors 244 and 245 connected emitter-to-emitter to its common terminal 242 and connected base-to-base to receive identical base potentials as determined by direct-coupled collector-to-base feedback provided transistor 244 by direct connection 246. The area of the base-emitter junction of transistor 244 is made n times as large as the area of the base-emitter junction of transistor 245, which accounts for current mirror amplifier 240 having the current gain of $-1n$. The direct connection 246 causes the combined base currents of transistors 244 and 245 to provide a portion of the collector current $I_{C203}$ demanded by transistor 203, making the collector current of transistor 244 and consequently that of transistor 245 somewhat smaller than $-I_{C203}/n$. This error can be compensated for by causing the quiescent base current of transistor 248 to be $(n+1)$ times smaller than the combined quiescent base currents of transistors 244 and 245. To this end, a constant sink 250 is used to demand a current $(n+1)$ times as small as that demanded by current sink 220, which demand must be met by quiescent current flow from transistor 248 in order that transistor 249 be maintained conductive. This can be done, for example, by making transistor 221 of current sink 220 with the area of its base-emitter junction $1/(n+1)$ times the size of the area of the base-emitter junction 251 and by making the resistance of resistive element 253 of current sink 250 $(n+1)$ times as large as resistive element 223.

FIG. 2 shows the collector electrode of transistor 202 being direct coupled to output terminal 214 by the common-base-amplifier action of a transistor 254. The base electrode of transistor 254 is biased to place substantially equal collector potentials on transistors 201 and 202 to eliminate this as a variable which would otherwise slightly affect the proportion between their relative transconductances. That is, "Early effect" as between transistors 201 and 202 is forestalled.

Figure 3:
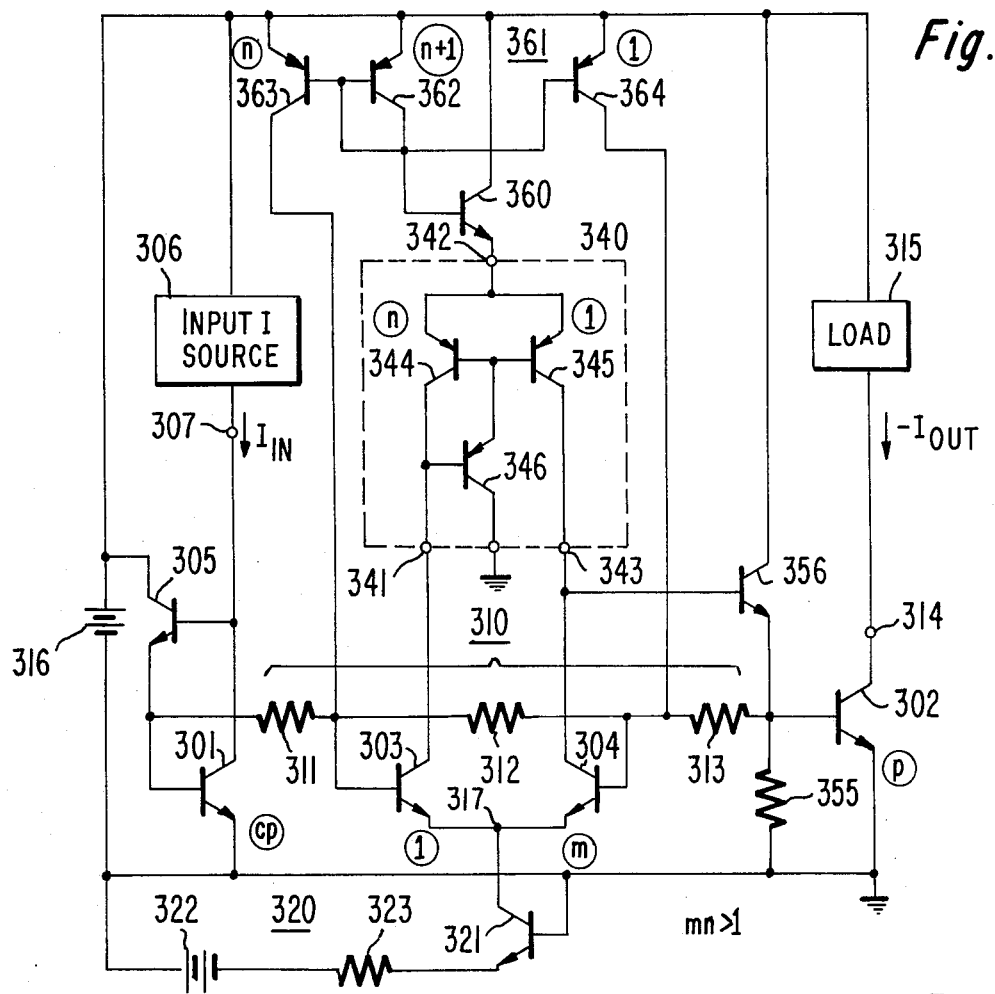

FIG. 3 shows a variant of the FIG. 2 current scaling apparatus wherein a resistive element 355 is connected to pull current through resistive elements 311, 312, 313 of resistive potential divider 310 and thus reduce the base-emitter potential of transistor 302. If the current pulled through resistive divider 310 is too great, an error signal current flows as base current to the base electrode of common-collector amplifier transistor 256, a non-inverting current amplifier, to supply the excess demand through resistive element 355 rather than through potential divider 310.

Current mirror amplifier 340 has a common-collector amplifier transistor 346 to conduct the combined base currents of transistors 344 and 345, to cause the collector current of transistor 344 to more nearly match that of transistor 303. The base current demand of transistor 356 is preferably kept light. This can be done by making the transistor 356 a composite transistor comprising a Darlington cascade connection of individual transistors, if need be.

FIG. 3 also shows the base current flows of transistors 303 and 304 being substantially cancelled by a unity gain positive feedback arrangement implemented by elements 360–364. This eliminates the errors in potential division by potential divider 310 owing to the flow of the base currents of transistors 304 and 305 through only certain of its resistors 311, 312, 313. Transisor 360 responds to the combined collector currents of transistors 303 and 304 with a base current $(h_{feNPN} + 1)$ times smaller, where $h_{feNPN}$ is the nominal value of common emitter forward current gain of transistors 303, 304 and 360. This base current is applied to self-biased transistor 362 of a dual-output current mirror amplifier 361. The resultant base potential of transistor 362 is applied to the base electrodes of transistors 363 and 364 which respond to supply respective collector currents respectively to the base electrode of transistor 303 and to the base electrode of transistor 304. The areas of the base-emitter junctions of transistors 362, 363 and 364 are in $(n+1):n:1$ ratio, respectively, to effect the cancellation. Other similar base current cancellation techniques may be used also.

Figure 4:
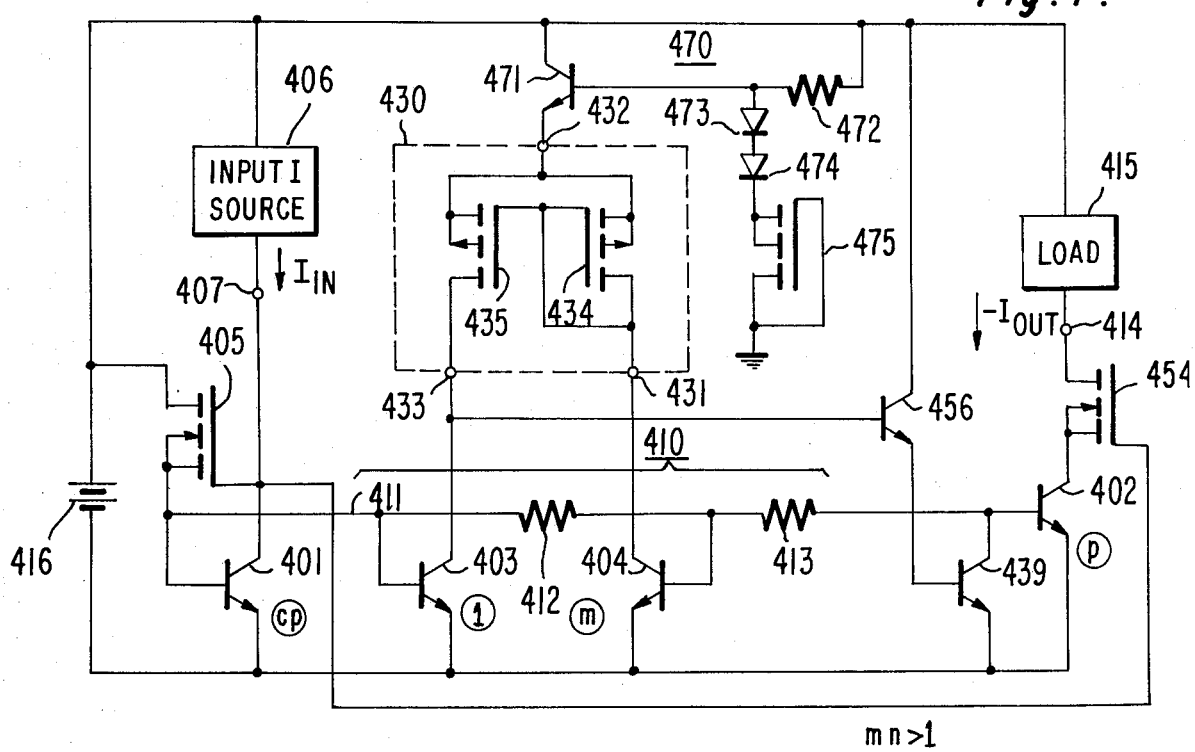

FIG. 4 illustrates current scaling apparatus in which the product of $m$ times $n$ exceeds unity. This apparatus is similar in many respects to that of FIG. 1. Perhaps the most striking difference is that since, as noted, the value of current supplied by source 120 to node 117 is not particularly critical in the FIG. 1 apparatus, in the FIG. 4 apparatus the emitter electrodes of transistors 403 and 404 are connected directly to the same reference potential as the emitter electrodes of transistors 401 and 402. (Indeed, in the current scaling apparatuses of FIGS. 1, 2 and 3, nodes 117, 217 and 317 can be connected to the negative terminals of potential supplies 116, 216 and 316, respectively, to permit dispensing with current supplies 120, 220 and 320, respectively. In the FIG. 2 current scaling apparatus, current supply 250 may then be replaced by a grounded-emitter amplifier transistor with collector connected per that of transistor 251 and base electrode biased from a suitable point along the resistive potential divider 210.)

The positioning of the base electrodes of transistors 403 and 404 along the resistive potential divider 410 affects the ratio of their combined emitter current levels to the emitter current level of transistor 401. In the particular configuration shown in FIG. 4, the base electrode of transistor 403 is biased at the same potential as that of transistor 401, and resistive element 411 is zero-valued in resistance—i.e., is a direct connection. This keeps the level of the error signal amplified by the common-collector amplifier transistor 456 and applied to the base electrode of transistor 439 as large as possible, to maintain accuracy of the current scaling as good as possible as $I_{IN}$ drops in value. At the same time, making the resistive element 411 zero-valued in resistance eliminates scaling error in the resistive potential divider due to the base current of transistor 403.

The FIG. 4 current scaling apparatus employs both bipolar and field-effect transistors. Field-effect transistors have no appreciable current flow to their gate electrodes which avoids base current errors in the source-follower transistor 405, the current mirror amplifier 430, and the common-gate amplifier transistor 454 in cascode with transistor 402. A source 470 of potential applied to common terminal 432 of current mirror amplifier 430 which comprises element 471–475 will place substantially equal quiescent source-to-drain potentials on transistors 434 and 435, better to maintain their relative transconductances in 1:n ratio. Transistor 456 is joined in Darlington configuration with transistor 439 to lessen the error current required for the degenerative feedback loop to regulate the potential between the base electrodes of transistors 403 and 404 close to predicted value. Arrangements where transistor 456 is replaced by a source-follower field-effect transistor are also possible. In such a circuit, the error signal at its gate electrode is a potential rather than a current and the source 470 must be appropriately modified—e.g., by replacing one of the diodes 473 and 474 with a self-biased field-effect transistor.

Figure 5:
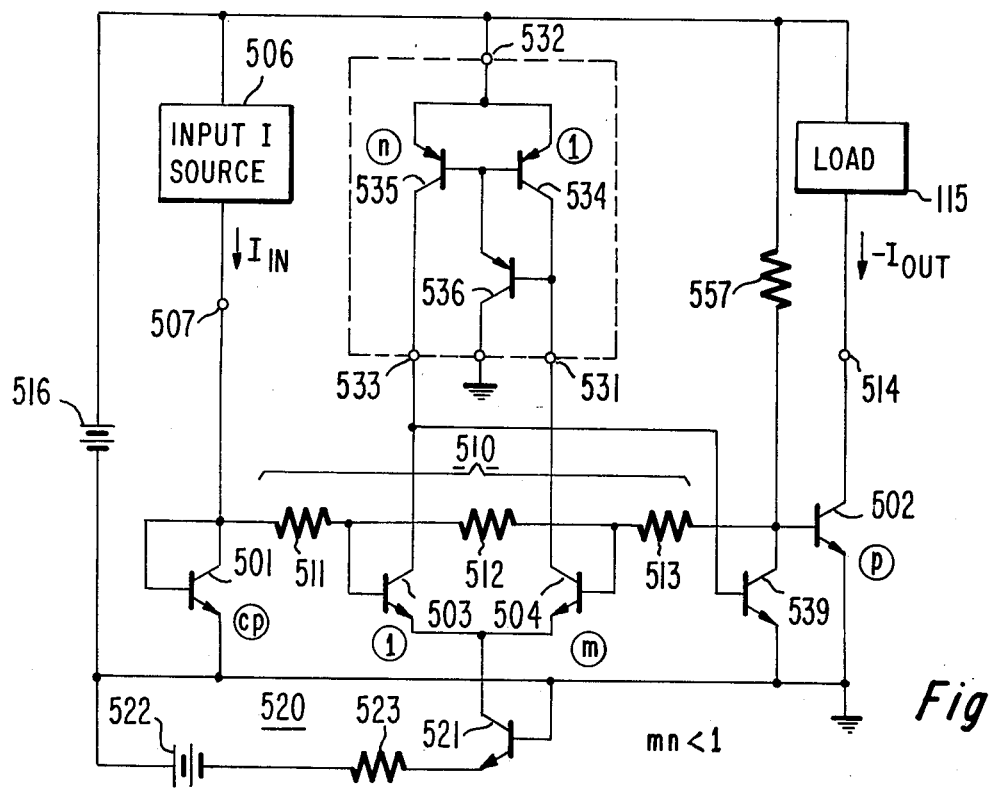

FIG. 5 shows apparatus for scaling up a current $I_{IN}$ to obtain a larger current $-I_{OUT}$ directly proportional to $I_{IN}$, which apparatus greatly resembles that shown in FIG. 1. While $mn$ was made larger than 1 in the FIG. 1 apparatus, however, in the FIG. 5 apparatus $mn$ is made smaller than 1. Thus, in equation 5, the polarity of the potential identifiable as $(V_{BE103} -: V_{BE104})$ with respect to the FIG. 1 apparatus and homologously identifiable as $(V_{BE503} - V_{BE104})$ with respect to the FIG. 5 apparatus is reversed; that is, the negative feedback loop regulating the value of this potential adjusts $V_{BE504}$ to be larger than $V_{BE503}$. Resistor 557 is added to the current scaling apparatus to provide a path for current to the resistive potential divider 510 and thus to establish the tendency for $V_{BE502}$ to exceed $V_{BE504}$ to exceed $V_{BE503}$ to exceed $V_{BE501}$, which tendency is then regulated by the feedback loop completed through transistor 539.

Figure 6:
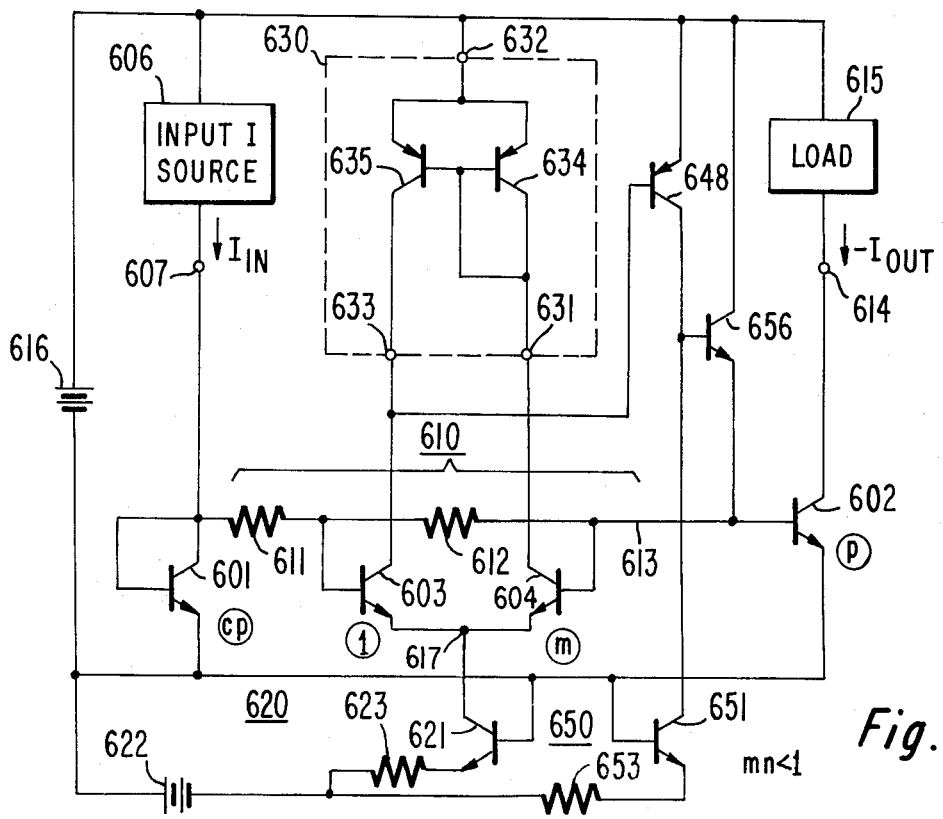

FIG. 6 shows another apparatus for scaling up a current $I_{IN}$ to obtain a larger current $-I_{OUT}$, in which $mn$ is less than unity. In this current scaling apparatus, the inverting amplification provided in the FIG. 5 apparatus by common-emitter amplifier NPN transistor 539 is replaced by that provided by common-emitter amplifier 648 followed in direct coupled cascade by NPN emitter follower transistor 656. Transistor 648 can be connected with current supply 650 in such a way that its quiescent base current compensates the base current errors in the simple current mirror amplifier 630, analogous to the way quiescent bias was coupled to transistor 248 in the FIG. 2 current scaling apparatus. Resistive element 613 is shown as a direct connection—i.e., zero-valued in resistance—which eliminates potential division across in resistive potential divider 610 otherwise caused by the base current of transistor 604.

Figure 7:
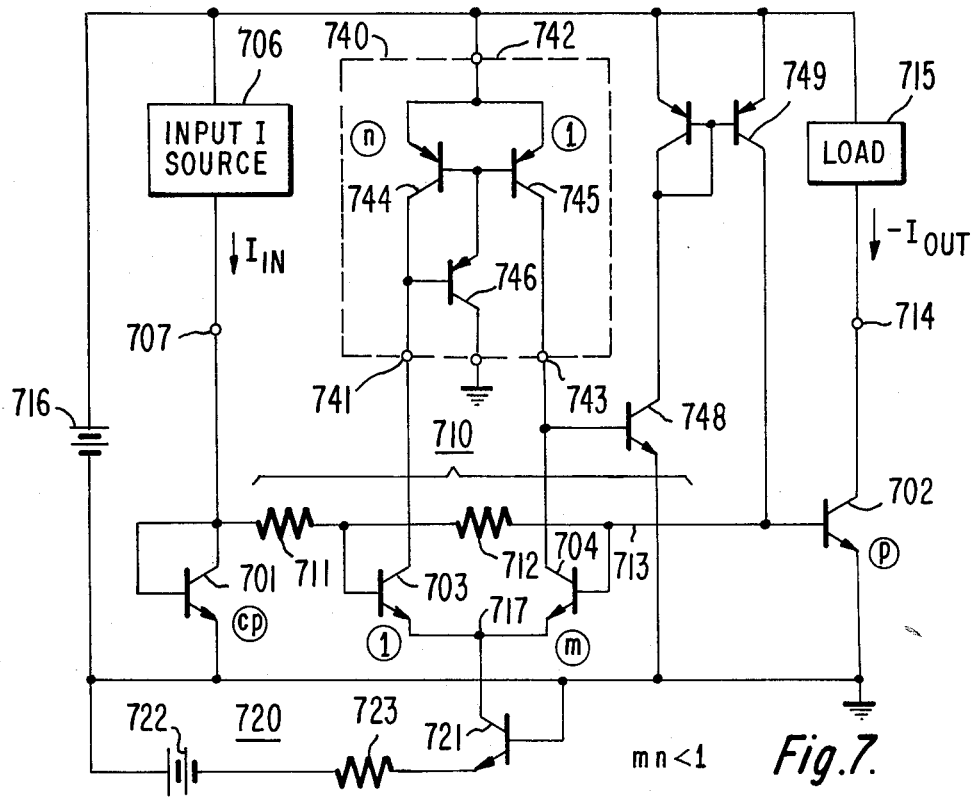

FIG. 7 shows still other apparatus for scaling up a current $I_{IN}$ similar to the FIG. 2 apparatus for scaling down from a current $I_{IN}$, except $mn$ is smaller than unity for the FIG. 7 apparatus rather than larger than unity as for the FIG. 2 apparatus. Transistor 749 may, as shown, have a self-biased transistor connected across its base-emitter junction to form a current mirror amplifier or, alternatively, may be used without such self-biased transistor.

Figure 8:
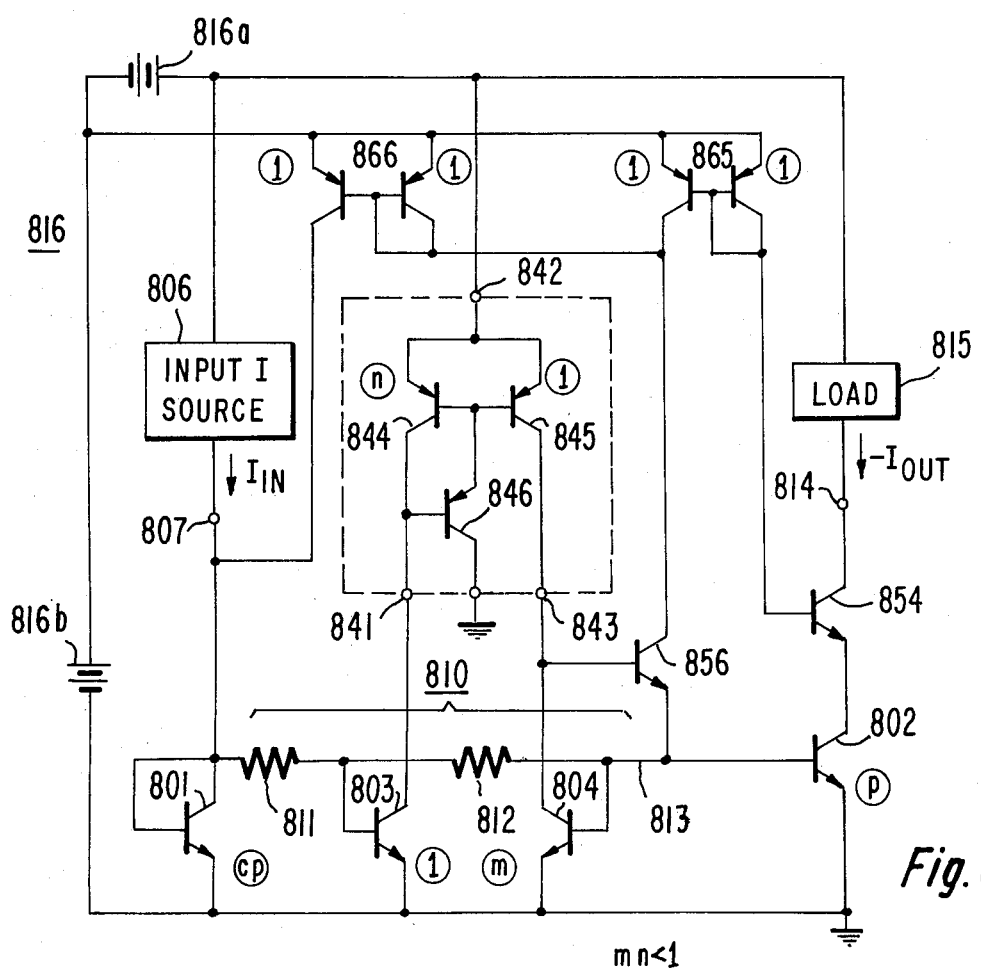

FIG. 8 shows a current scaling apparatus similar to that of FIG. 3 in basic structure, but wherein $mn$ is less than unity so $-I_{OUT}$ is larger than and proportional to $I_{IN}$. Current source 320 is dispensed with and the emitter electrodes of transistors 803 and 804 are instead directly connected to ground reference potential analogously to the practice in the FIG. 4 apparatus. The common terminal 842 of current mirror amplifier 840 is not connected to base current compensating circuitry, but instead directly to the positive terminal of a battery 816 of serially connected direct potential supplies 816a and 816b.

A circuit to eliminate the current flow through potential divider 810 into self-biased transistor 801 is shown, which makes the base-emitter potential $V_{BE801}$ of that transistor substantially solely dependent upon $I_{IN}$. The collector current of transistor 856 is substantially similar to its emitter current. That portion of the emitter current of transistor 856 applied to the base electrode of transistor 802 causes a collector current response larger by the common emitter forward current gain or $h_{fe}$ of transistor 802. This collector current response is applied to the emitter electrode of transistor 854 and causes a base current thereto smaller by the quantity its $h_{fe}$ plus one. Assuming transistors 802 and 854 to have substantially equal $h_{fe}$'s, $h_{feNPN}$, this means their base currents are of substantially equal value. The base current flow of transistor 854 is inverted in current mirror amplifier 865 and used to counteract a portion of the collector current of transistor 856 substantially equal to the portion of the emitter current of transistor 856 supplied to the base electrode of transistor 802. The remaining portion of the collector current of transistor 856 is similar in amplitude to that portion of its emitter current flowing through resistive potential divider 810 and is inverted in current mirror amplifier 866 to counteract the flow of current through potential divider 810 to the input terminal 807.

The problem of current flow in the potential divider affecting current flow in the transistor with an identification numeral ending in 01 is (as has been noted above) simply solved in current scaling apparatus where $mn$ exceeds unity, just by including an emitter-follower or source-follower in its collector-to-base connection. So, one may choose to scale up current by using a high-gain current amplifier which is provided with degenerative current feedback by means of a current scaling apparatus affording current attentuation. If the open-loop gain of the current amplifier is much larger than the attenuation of the current scaling apparatus, its closed-loop gain will closely approximate the attenuation of the current scaling apparatus, in accordance with conventional feedback theory. The closeness of the approximation is improved as the gain of the current amplifier is made larger relative to the attenuation of the current scaling apparatus.

The effects of the base currents of the transistors with identification numerals ending in 01, 02, 03 and 04 upon the proportioning of their base-emitter offset potentials can be reduced by making them so-called super-beta type—that is, by making the widths of their base regions very small. Appropriate circuit design measures (e.g., cascoding) should then be taken so that their emitter-to-collector potentials are small enough to avoid breakdown and preferably so that their emitter-to-collector potentials are as well-matched as possible to avoid misproportioning between their transconductance characteristics due to Early effect.

What is claimed is:

1. A current scaling apparatus comprising, in combination:

first and second and third and fourth transistors, each having base and emitter electrodes and a base-emitter junction therebetween and having a collector electrode, said first and said second transistors being of the same conductivity type as each other and having interconnected emitter electrodes, said third and said fourth transistors being of the same conductivity type as each other and having interconnected emitter electrodes;

means operating said third and said fourth transistors with different densities of current flow through their respective base-emitter junctions for defining a difference between their respective base potentials;

means for scaling up the difference between the base potentials of said third and said fourth transistors by a fixed ratio; and means applying the scaled up difference potential between the base electrodes of said first and said second transistors for determining the ratio between their respective collector currents.

2. A current scaling apparatus as set forth in claim 1 wherein said means for scaling up the difference between the base potentials of said first and said second transistors comprises direct current impedance means across which said difference potential between said base potentials is applied thereby to establish a flow of current through said impedance means, a series circuit, including said impedance means and another direct current impedance means through which said current flows, and a pair of terminals connected to points along said series circuit for producing said scaled up difference between potentials.

3. A current scaling apparatus for responding to an input current to supply an output current proportional to its said input current, said current scaling apparatus comprising:

first and second and third and fourth junction transistors, all made of the same basic semiconductive material and operated at substantially the same absolute temperature T, each having base and emitter electrodes with a base-emitter junction therebetween and each having a collector electrode, said first and said second transistors being of the same conductivity type as each other and said third and said fourth transistors being of the same conductivity type as each other;

an input terminal for receiving said input current, galvanically coupled to the collector electrode of said first transistor;

an output terminal for delivering said output current to which the collector electrode of said second transistor is galvanically coupled;

a common terminal for return of said input and output currents, to which the emitter electrodes of said first and said second transistors are directly connected without substantial intervening impedance;

means applying direct-coupled degenerative collector-to-base to said first transistor for regulating its base potential to condition it to accept as collector current essentially the entire input current as received at said input terminal and galvanically coupled to its collector electrode;

a potential divider having an input port connected between the base electrodes of said first and said second transistors and having an output port connected between the base electrodes of said third and said fourth transistors;

first direct current conductive means, linking said common terminal and a first circuit node, to which node the emitter electrodes of said third and said fourth transistors are directly connected without substantial intervening impedance;

differential combining means for differentially combining the collector currents of said third and said fourth transistors to develop an error signal when the potential between the base electrodes of said thid and said fourth transistors departs from a predetermined value; and means responsive to said error signal for applying a current proportional to said error signal, applied at the base electrode of said second transistor in a sense to degenerate said error signal.

4. A current scaling apparatus as set forth in claim 3 wherein the area of the base-emitter junction of said fourth transistor is m times as large as the area of the base-emitter junction of said third transistor; said differential combining means is a current amplifier having an input connection to which the collector electrode of said fourth transistor is connected, having an output connection connected to a second circuit node to which the collector electrode of said third transistor is also connected and at which said error signal is provided, and exhibiting a current gain of -n between its said input and output connections; and the product of m times n is chosen larger than unity, thereby tending to cause said output current to be smaller than said input current by a predetermined ratio substantially independent of the values of said input and output currents over an operating range.

5. A current scaling apparatus as set forth in claim 4 wherein said means responsive to said error signal for applying a current includes:

a fifth transistor being of the same conductivity type as said first and said second transistors, having a base electrode to which said second circuit node is direct coupled, having an emitter electrode referred in potential to said common terminal, and having a collector electrode direct coupled to the base electrode of said second transistor.

6. A current scaling apparatus as claimed in claim 4 wherein said means applying direct-coupled degenerative feedback to said first transistor comprises a further transistor connected as a potential follower with input connection and output connection at the collector and base electrodes, respectively, of said first transistor.

7. A current scaling apparatus as set forth in claim 3 wherein the area of the base-emitter junction of said fourth transistor is m times as large as the area of the base-emitter junction of said third transistor; said differential combining means is a current amplifier having an input connection to which the collector electrode of said third transistor is connected, having an output connection connected to a second circuit node to which the collector electrode of said fourth transistor is also connected and at which said error signal is provided, and exhibiting current gain $-1/n$ between its said input and output connections; and the product of m times n is chosen larger than unity, thereby tending to cause said output current to be smaller than said input current by a predetermined ratio substantially independent of the values of said input and output currents over an operating range.

8. A current scaling apparatus as set forth in claim 7 wherein said means responsive to said error signal for applying a current includes:

fifth and sixth transistors respectively of opposite conductivity type to and of the same conductivity type as the conductivity type of said first and said second transistors;

means connecting said fifth transistors in common-emitter amplifier configuration, including a direct coupling of said second circuit node to the base electrode of said fifth transistor;

means connecting said sixth transistor in common-emitter amplifier configuration, including a direct coupling of its collector electrode to the base electrode of said second transistor; and means connecting the aforeclaimed common-emitter amplifier configuration is cascade, including a direct coupling of the collector electrode of said fifth transistor to the base electrode of said sixth transistor.

9. A current scaling apparatus as set forth in claim 7 wherein said means responsive to said error signal for applying a current includes:
a fifth transistor being of the same conductivity type as said first and said second transistors, having a base electrode to which said second circuit node is direct coupled, having an emitter electrode direct coupled to the base electrode of said second transistor, and having a collector electrode biased to condition said fifth transistor for emitter-follower operation.

10. A current scaling apparatus as claimed in claim 7 wherein said means applying direct-coupled degenerative feedback to said first transistor comprises a fourth transistor connected as a potential follower with input connection and output connection at the collector and base electrodes, respectively, of said first transistor.

11. A current scaling apparatus as set forth in claim 3 wherein the area of the base-emitter junction of said fourth transistor is m times as large as the area of the base-emitter junction of said third transistor; said differential combining means is a current amplifier having an input connection to which the collector electrode of said fourth transistor is connected, having an output connection connected to a second circuit node to which the collector electrode of said third transistor is also connected and at which said error signal is provided, and exhibiting a current gain of $-n$ between its said input and output connections; and the product of $m$ times $n$ is chosen smaller than unity, thereby tending to cause said output current to be larger than said input current by a predetermined ratio substantially independent of the values of said input and output currents over an operating range.

12. A current scaling apparatus as set forth in claim 11 wherein said means responsive to said error signal for applying a current includes:
a fifth transistor being of the same conductivity type as said first and said second transistor, having a base electrode to which said second circuit node is direct coupled, having an emitter electrode referred in potential to said common terminal, and having a collector electrode direct coupled to the base electrode of said second transistor, together with
means for applying a current to the base electrode of said second transistor to forward bias its base-emitter junction.

13. A current scaling apparatus as set forth in claim 11 wherein said means responsive to said error signal for applying a current includes:
a fifth transistor being of the same conductivity type as said first and said second transistors, having a base electrode to which said second circuit node is direct coupled, having an emitter electrode biased to operate said fifth transistor in common-emitter amplifier configuration, and having a collector electrode connected to the base electrode of said second transistor; and
means for applying a flow of current to the base electrode of said second transistor opposing the flow of the collector current of said fifth transistor to the base electrode of said fifth transistor.

14. A current scaling apparatus as set forth in claim 3 wherein the area of the base-emitter junction of said fourth transistor is m times as large as the area of the base-emitter junction of said third transistor; said differential combining means is a current amplifier having an input connection to which the collector electrode of said third transistor is connected, having an output connection connected to a second circuit node to which the collector electrode of said fourth transistor is also connected and at which said error signal is provided, and exhibiting a current gain of $-1/n$ between its said input and output connections; and the product of m times n is chosen smaller than unity, thereby tending to cause said output current to be larger than said input current by a predetermined ratio substantially independent of the values of said input and output currents over an operating range.

15. A current scaling apparatus as set forth in claim 14 wherein said means responsive to said error signal for applying a current includes:
fifth and sixth transistors, respectively of the same conductivity type as and of opposite conductivity type to the conductivity type of said first and said second transistors, and
means for connecting each of said fifth and sixth transistors in common emitter amplifier configuration wherein
said second circuit node is direct coupled to the base electrode of said fifth transistor, the collector electrode of said fifth transistor is direct coupled to the base electrode of said sixth transistor and the collector electrode of said sixth transistor is direct coupled to the base electrode of said second transistor.

16. A current scaling apparatus as set forth in claim 14 wherein said means responsive to said error signal for applying a current includes:
a fifth transistor being of the same conductivity type as said first and said second transistors, having a base electrode to which said second circuit node is direct coupled, having an emitter electrode direct coupled to the base electrode of said second transistor, and having a collector electrode biased to condition said fifth transistor for emitter-follower operation.

17. A current scaling apparatus as set forth in claim 3 wherein said potential divider comprises a first resistance across which its said output port appears and at least one further resistance across which and said first resistance its said input port appears.

18. A current scaling apparatus as set forth in claim 3 wherein said first direct current conductive means comprises a source of direct current.

19. A current scaling apparatus as claimed in claim 3 wherein said first direct current conductive means consists of a direct connection of said first circuit node to said common terminal.

20. Apparatus comprising:
first and second transistors of the same conductivity type, each having base and emitter electrodes with a base-emitter junction therebetween, having a collector electrode, and being operated at substantially the same temperature T;
means for applying a current to the interconnection of the emitter electrodes of said first and said second transistors which is of a polarity tending to forward bias their respective base-emitter junctions and thus cause respective collector current flows through their respective collector electrodes;

means for differentially combining in predetermined proportion the collector currents of said first and said second transistors to obtain an error signal;

a number, at least one, of further semiconductor junctions operated at substantially the temperature T;

a plurality of resistive means with resistances in fixed proportion to each other connected in series connection with said number of further semiconductor junctions;

means for applying a current proportional to said error signal to said series connection in a sense to forward bias each of said number of further semiconductor junctions, thereby to develop an output potential across said series connection characteristic of a multiple of the offset potential across a semiconductor junction operated at higher current density than each said further semiconductor junction; and means applying a portion of said output potential, as appears across one of said resistive means, between the base electrodes of said first and said second transistors in a sense for completing a degenerative feedback loop for regulating this potential to a predictable value.

21. Apparatus as set forth in claim 20 wherein said first and said second transistors are physically proportioned so the second transistor would have $m$ times the collector current of said first transistor were they to have similar emitter-to-base potentials; wherein said means for differentially combining their collector currents in predetermined proportion comprises a current amplifier having an input terminal to which the collector electrode of said first transistor is connected, having an output terminal to which the collector electrode of said second transistor is connected and at which said error signal appears, and providing a current gain of minus unity divided by $n$ between its input and output terminals; and wherein said means for applying a current proportional to said error signal comprises a third transistor, being of the same conductivity type as said first and said second transistor, being operated as a common-collector amplifier, having a base electrode to which said error signal is applied by direct coupling, and having an emitter electrode direct coupled to the end of said series connection more remote from the base electrode of said first transistor than from the base electrode of said second transistor, m and n being positive numbers, the product of which exceeds unity and said predictable value of potential between the base electrodes of said first and said second transistors being equal to $(kT/p) \ln (mn)$, where $k$ is Boltzmann's constant and $q$ is the charge on an electron.

22. Apparatus as set forth in claim 20 wherein said first and said second transistors are physically proportioned so the second transistor would have $m$ times the collector current of said first transistor were they to have similar emitter-to-base potentials; wherein said means for differentially combining their collector currents in predetermined proportion comprises a current amplifier having an input terminal to which the collector electrode of said second transistor is connected, having an output terminal to which the collector electrode of said first transistor is connected and at which said error signal appears, and providing a current gain of n between its input and output terminals; and wherein said means for applying a current proportional to said error signal comprises a third transistor, being of complementary conductivity type to that of said first and said second transistors, being operated as a common-emitter amplifier, having a base electrode to which said error signal is applied by direct coupling, and having a collector electrode direct coupled to the end of said series connection more remote from the base electrode of said first transistor than from the base electrode of said second transistor, $m$ and $n$ being positive numbers the product of which is less than unity and said predictable value of potential between the base electrode of said first and said second transistors being equal to $(kT/q) \ln (mn)$, where $k$ is Boltzmann's constant and $q$ is the charge on an electron.

23. Apparatus as set forth in claim 20 used in combination with a third transistor operated at substantially said temperature T for determining current flowing through a collector electrode of said third transistor, said third transistor having base and emitter electrodes respectively connected to opposite ends of said series connection and having a base-emitter junction between its base and emitter electrodes.

24. Apparatus comprising:
a first terminal connected to a point of reference potential, a second terminal, and a third terminal;

first and second transistors of the same conductivity type, each having base and emitter electrodes with a base-emitter junction therebetween, having a collector electrode, and being operated at substantially the same temperature T;

means for applying a current to the interconnection of the emitter electrodes of said first and said second transistors which is of a polarity tending to forward bias their respective base-emitter junctions and thus cause respective collector current flows through their respective collector electrodes;

means for differentially combining in predetermined proportion the collector currents of said first and said second transistors to obtain an error signal;

a number, at least one, of further semiconductor junctions operated at substantially the temperature T arranged in a current path between said first and said second terminals with no substantial intervening impedance;

an input current source connected between said first and said second terminals for applying an input current of a polarity to forward bias each said further semiconductor junction connected therein, responsive to which an offset potential appears between said first and said second terminals;

resistance means connected between said second terminal and said third terminal;

means for applying a current proportional to said error signal to said series connection, responsive to which a potential appears between said second and said third terminals;

means applying the potential appearing across a portion of said resistance means between the base electrodes of said first and second transistors, thereby completing a degenerative feedback loop for regulating this potential to a predictable value; and means connected between said first and said third terminals for utilizing the potential appearing therebetween.

25. Apparatus as set forth in claim 24 wherein said first and said second transistors are physically proportioned so the second transistor would have m times the collector current of said first transistor were they to have similar emitter-to-base potentials; and wherein said means for differentially combining their collector currents in predetermined proportion comprises a current amplifier having an input terminal to which the collector electrode of said second transistor is connected, having an output terminal to which the collector electrode of said first transistor is connected and at which said error signal appears, and providing a current gain of minus one divided by n between its input and output terminals, m and n being positive numbers and said predictable value of potential between the base electrodes of said first and said second transistors being equal to $(kT/q) \ln (mn)$, where $k$ is Boltzmann's constant and $q$ is the charge on an electron.

26. Apparatus as set forth in claim 24 wherein said first and said second transistors are physically proportioned so the second transistor would have m times the collector current of said first transistor were they to have similar emitter-to-base potentials; and wherein said means for differentially combining their collector currents in predetermined proportion comprises a current amplifier having an input terminal to which the collector electrode of said first transistor is connected, having an output terminal to which the collector electrode of said second transistor is connected and at which said error signal appears, and providing a current gain of n between its input and output terminals, $m$ and $n$ being positive numbers and said predictable value of potential between the base electrodes of said first and said second transistors being equal to $(kT/q) \ln (mn)$, where $k$ is Boltzmann's constant and $q$ is the charge on an electron.

27. Apparatus as set forth in claim 24 wherein said means connected between said first and said third terminals for utilizing the potential appearing therebetween includes a third transistor being operated at substantially said temperature T, having base and emitter electrodes connected to separate ones of said first and said third terminals, and having a collector electrode for conducting an output current proportionally responsive to said input current.

* * * * *

UNITED STATES PATENT OFFICE
CERTIFICATE OF CORRECTION

PATENT NO. : 4,055,774

DATED : October 25, 1977

INVENTOR(S) : Adel Abdel Aziz Ahmed

It is certified that error appears in the above-identified patent and that said Letters Patent are hereby corrected as shown below:

Col 1, line 26, "numbers" should be --numerals--.

Col 2, formula (1), "(kT/g)" should be --(kT/q)--.

Col 2, line 48, "of" should be --or--.

Col 3, line 20, "unit" should be --unity--.

Col 4, equation 12, "$I_{C102}=I_{Cj101}/c(mn)^{[(R_{111}30R_{112}+R_{113})/R_{112}]}$" should be --$I_{C102}=I_{C101}/c(mn)^{[(R_{111}+R_{112}+R_{113})/R_{112}]}$--

Col 4, line 18, after "to" insert --be--.

Col 4, line 19, "$R_{11}$" should be --$R_{111}$--.

Col 4, line 36, "$I_{In}$" should be --$I_{IN}$--.

Col 4, line 41, "configuration" should be --configurations--.

Col 4, line 61, "has" should be --as--.

Col 5, line 14, "-ln" should be --1/n--.

Col 5, line 23, after "constant" insert --current--.

UNITED STATES PATENT OFFICE
CERTIFICATE OF CORRECTION

PATENT NO. : 4,055,774

DATED : October 25, 1977

INVENTOR(S) : Adel Abdel Aziz Ahmed

It is certified that error appears in the above-identified patent and that said Letters Patent are hereby corrected as shown below:

Col 6, line 14, "(n+1):nl" should be --(n+1):n:1--.

Col 7, line 13, "($V_{BE103}$-:$V_{BE104}$)" should be --($V_{BE103}$-$V_{BE104}$)--

Col 7, line 28, "emiter" should be --emitter--.

Col 9, line 65, "thid" should be --third--.

Col 13, line 51, "(kT/p)" should be --(kT/q)--.

In FIGURE 4 of the drawing transistors 434 and 435 should have an encircled "1" and encircled "n", respectively, next to them.

In FIGURE 6 of the drawing transistors 634 and 635 should have an encircled "1" and encircled "n", respectively, next to them.

Signed and Sealed this

Ninth Day of May 1978

[SEAL]

Attest:

RUTH C. MASON
Attesting Officer

LUTRELLE F. PARKER
Acting Commissioner of Patents and Trademarks